(12) United States Patent
Kubo et al.

(10) Patent No.: US 6,720,807 B1
(45) Date of Patent: Apr. 13, 2004

(54) SEMICONDUCTOR DEVICE WITH CLOCK GENERATION CIRCUIT

(75) Inventors: Takashi Kubo, Hyogo (JP); Hisashi Iwamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/377,738

(22) Filed: Mar. 4, 2003

(30) Foreign Application Priority Data

Oct. 25, 2002 (JP) ........................................ 2002-311021

(51) Int. Cl.$^7$ ................................................ H03L 7/00
(52) U.S. Cl. ........................................ 327/141; 327/161
(58) Field of Search ........................ 327/141, 144–147, 327/149, 150, 152–156, 158, 159, 161, 292, 294

(56) References Cited

U.S. PATENT DOCUMENTS

| | | | | |
|---|---|---|---|---|
| 6,351,169 B2 | * | 2/2002 | Kuge | 327/161 |
| 6,373,303 B2 | * | 4/2002 | Akita | 327/156 |
| 6,400,643 B1 | * | 6/2002 | Setogawa | 365/233 |
| 6,417,715 B2 | * | 7/2002 | Hamamoto et al. | 327/291 |
| 6,426,900 B1 | * | 7/2002 | Maruyama et al. | 365/194 |
| 6,493,829 B1 | * | 12/2002 | Kubo | 713/500 |
| 6,552,587 B2 | * | 4/2003 | Kim et al. | 327/158 |

FOREIGN PATENT DOCUMENTS

| | | |
|---|---|---|
| JP | 10-112182 | 4/1998 |
| JP | P2001-217705 A | 8/2001 |

* cited by examiner

*Primary Examiner*—My-Trang Nu Ton
(74) *Attorney, Agent, or Firm*—McDermott, Will & Emery

(57) ABSTRACT

An impedance adjustment circuit generates an internal impedance adjustment signal and an impedance adjustment entry signal based on an externally applied impedance control signal. A data processing circuit decodes the internal impedance adjustment signal in synchronization with an internal clock signal to generate an output buffer drive signal of 5 bits. When the output buffer drive signal is applied to an output circuit of the succeeding stage as well as to an output replica circuit in a DLL circuit, the impedance of the output replica circuit is adjusted following adjustment of the output impedance.

4 Claims, 13 Drawing Sheets

SEMICONDUCTOR DEVICE WITH CLOCK GENERATION CIRCUIT

BACKGROUND OF THE INVENTION

1. Field of the Invention

The present invention relates to semiconductor devices carrying out data output in synchronization with an external clock signal, more particularly, to a semiconductor device including a clock generation circuit generating an internal clock signal in synchronization with an external clock signal.

2. Description of the Background Art

Data transmission in a semiconductor device is executed by an output circuit in a semiconductor device driving a transmission line to transmit data to the receiving end. As an example of transmitting data with a semiconductor device connected to a transmission line whose one end is an open end, a transient phenomenon thereof will be described briefly hereinafter.

A transmission line connected to an output circuit has a characteristic impedance of 50 Ω in an ideal situation. The transmission line has one end connected to the output circuit whereas the other end is an open end (impedance corresponding to infinity). The data signal from the output circuit travels the transmission line as a signal wave of a voltage level corresponding to the resistance division ratio of the output impedance of the output circuit to the characteristic impedance of the transmission line at the connection end. At the receiving end of the transmission line that is an open end, the signal wave is totally reflected. A signal wave of two times the voltage is observed. The reflected signal wave returns to the connection end, and the reflected wave that is resistance-divided proceeds towards the receiving end.

When the output impedance of the output circuit matches the characteristic impedance of the transmission line in the above data transmission flow, i.e., when the output impedance is equal to the characteristic impedance, there will be no signal reflection at the connection end. No attenuation in the signal wave through the transmission line will occur.

In the case where the output impedance does not match the characteristic impedance, for example when the output impedance is lower than the characteristic impedance, the drivability of the transmission line will be excessive at the receiving end, resulting in overshooting/undershooting. When the output impedance is higher than the characteristic impedance, the drivability will be insufficient. The voltage level at the receiving end will become closer to the stable point in a stepped manner.

Since data transmission greatly depends on the output impedance, various devices for impedance matching has been provided in conventional LSIs (Large Scale Integrated Circuit). Recently, LSIs capable of impedance matching are proposed, taking into account impedance variation caused by change in the usage environment such as the fabrication process, used temperature, power supply voltage and the like as disclosed in, for example, Japanese Patent Laying-Open No. 2001-217705.

In such impedance matching, the output impedance must match even between the pull up and pull down of the output circuit. This is because mismatch in impedance between the pull up side and the pull down side of the output circuit will cause difference in the transition time of the rise and fall of the signal even if the individual impedance approximates each other at the pull up side and the pull down side. This difference in the transition time will adversely affect data transfer.

During data transfer in an LSI, high speed data transmission is required in addition to the above impedance matching. To this end, an internal clock signal generated by a clock generation circuit in synchronization with an external clock signal is used for control.

In a data transmission operation in synchronization with the external clock signal, deviation will occur although data output is in synchronization with the external clock signal if the external clock signal is first received at the LSI and data is then output from the LSI. There is a problem that determination of which clock transition the output data establishes synchronization with cannot be made at the receiver side.

Recently, LSIs include a DLL (Delay Locked Loop) circuit to generate an internal clock signal in synchronization with an external clock signal to keep the transition time position properly in phase with the external clock signal, whereby data transmission/reception is conducted by an internal clock signal that is completely in synchronization with the external clock signal. The DLL circuit delays the external clock signal internally in a fixed and variable manner to generate an internal clock signal for data output that is ahead in phase of the external clock signal.

By adjusting the phase of the internal clock signal for data output taking into consideration the delay in the clock input buffer that buffers the external clock signal and the data output buffer corresponding to the above-described output circuit, the phase of the external clock signal is set to match the phase of the data output. Therefore, an input replica circuit and an output replica circuit are provided as a replica delay circuit to compensate for the delay of the clock input buffer and data output buffer in the DLL circuit.

If the above-described impedance matching is established only for the output circuit and not for the output replica circuit in a semiconductor device with a DLL circuit, the output replica circuit cannot properly compensate for the delay of the output circuit. There is a possibility that the phase of the external clock signal will deviate from the matching state with the phase of the data output. Accordingly, proper data transmission in synchronization with an external clock signal in a semiconductor device will be inhibited.

SUMMARY OF THE INVENTION

An object of the present invention is to provide a semiconductor device with a clock generation circuit, capable of data transmission constantly in synchronization with an external clock signal at high speed before and after output impedance adjustment.

According to an aspect of the present invention, a semiconductor device operating in synchronization with an external clock signal includes a clock generation circuit generating an internal clock signal in synchronization with an external clock signal, an output circuit providing a data signal outside the semiconductor device in response to the internal clock signal, and an impedance adjustment circuit generating an impedance adjustment signal to adjust the output impedance of the output circuit. The clock generation circuit includes a replica delay circuit to delay the internal clock signal for a predetermined time corresponding to the predetermined time of a data signal output operation in the output circuit. The impedance adjustment circuit applies the impedance adjustment signal to the output circuit as well as to the replica delay circuit.

According to the present invention, by applying the impedance adjustment signal input to the output circuit also to an output replica circuit in the DLL circuit at the same time, the impedance of the output replica circuit is also adjusted following adjustment of the impedance of the output circuit. Therefore, the DLL circuit can constantly compensate for the delay in the output circuit to allow data transmission properly in synchronization with an external clock signal in an LSI.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
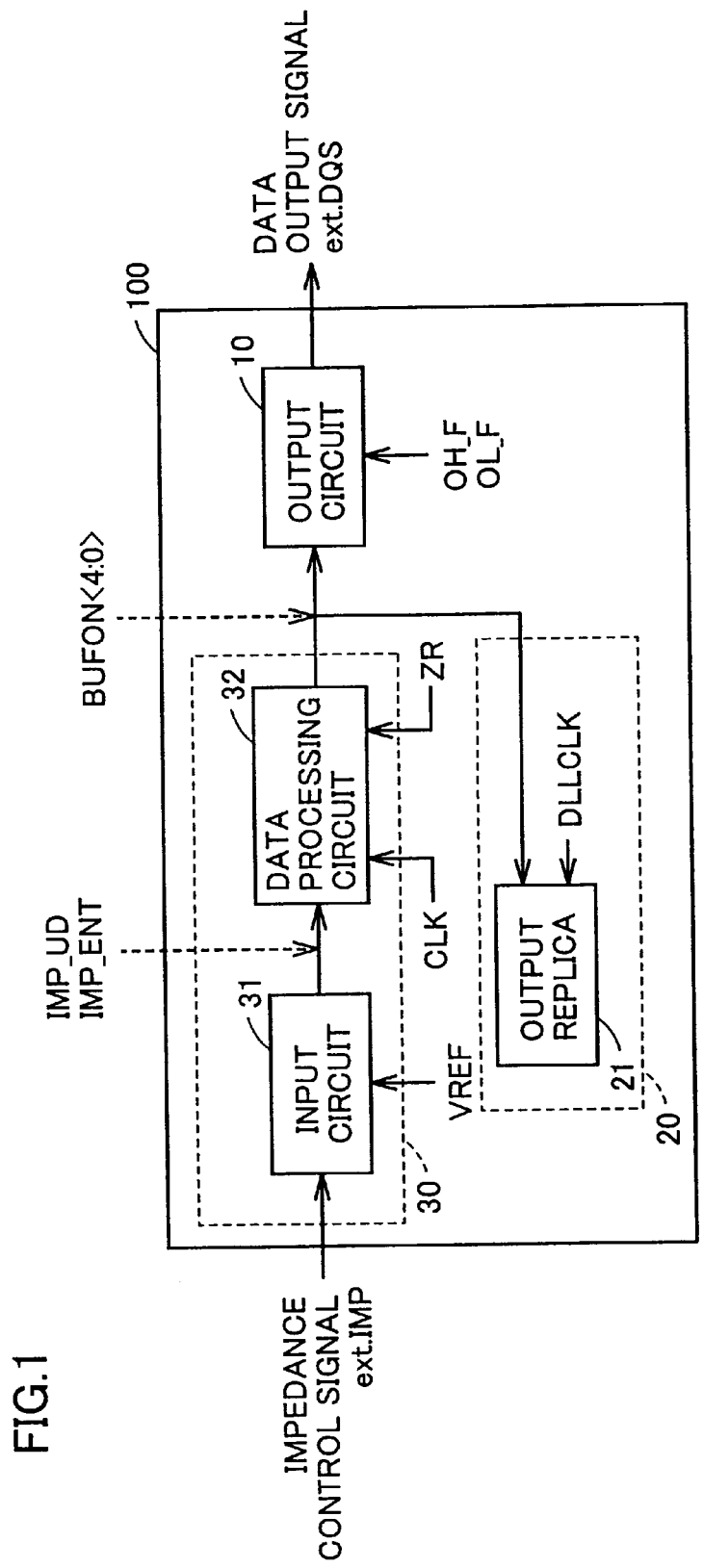
FIG. 1 schematically shows an extracted portion related to output impedance adjustment in a semiconductor device according to a first embodiment of the present invention.

Embodiments of the present invention will be described in detail hereinafter with reference to the drawings. In the drawings, the same reference characters denote the same or corresponding elements.

First Embodiment

FIG. 1 schematically shows an extracted portion related to output impedance adjustment in a semiconductor device according to the first embodiment.

The semiconductor device of FIG. 1 includes, in an LSI 100, an output circuit 10 buffering data transferred from an internal circuit not shown to output the buffered data to an external output terminal (not shown), a DLL circuit 20 generating an internal clock signal for output DLLCLK in synchronization with an external clock signal ext.CLK, and an impedance adjustment circuit 30 adjusting the output impedance.

As will be described afterwards, output circuit 10 includes an output buffer formed of five P channel MOS transistors connected in parallel between power supply voltage and an output node, and five N channel MOS transistors connected in parallel between ground voltage and the output node. When data OH_F and OL_F transferred from an internal circuit (not shown) are input, the output buffer buffers the same to output the data from an external output terminal (not shown) as a data output signal ext.DQS. Data OH_F and OL_F correspond to a signal having the two potential levels of H (logical high) and L (logical low). When data OH_F= H, a data output signal ext.DQS of an H level is output. When data OL_F=H, a data output signal ext.DQS of an L level is output.

Figure 2:
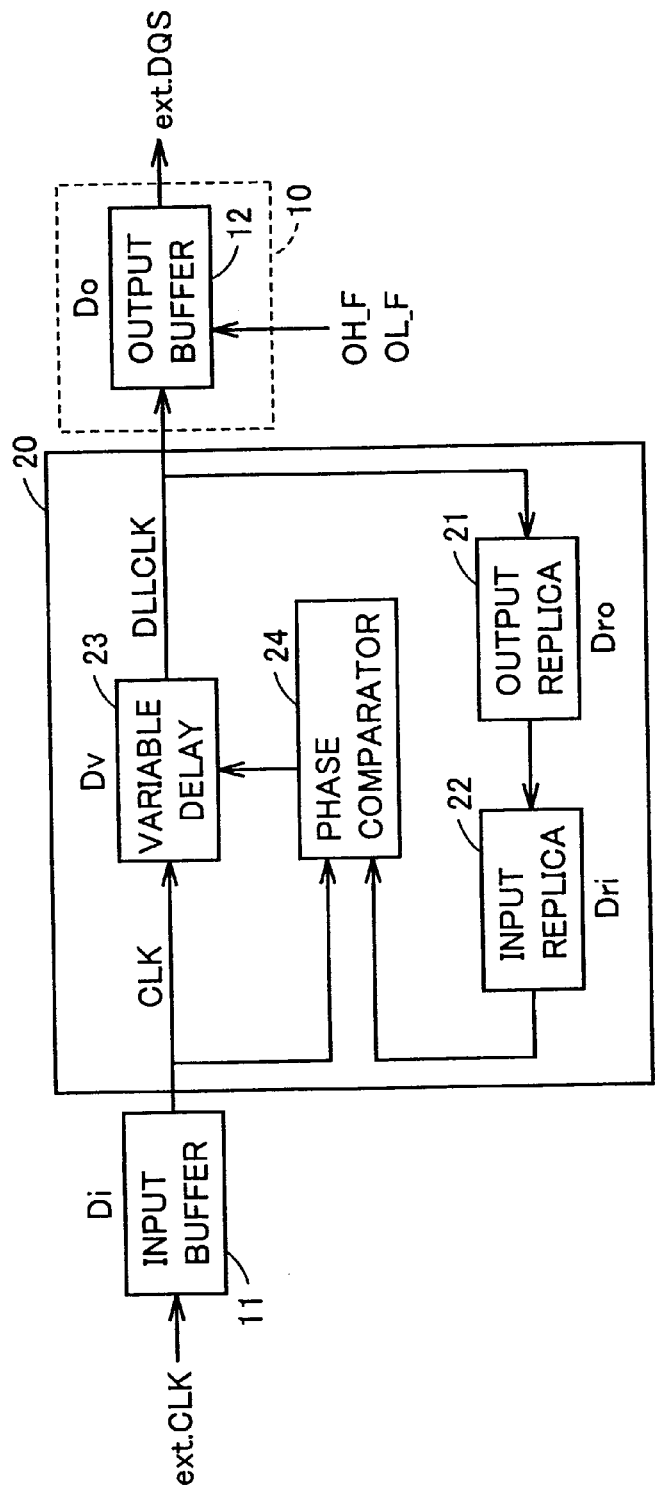
FIG. 2 schematically shows an example of a DLL circuit incorporated in the semiconductor device of FIG. 1.

FIG. 2 schematically shows an example of DLL circuit 20 incorporated in the semiconductor device of FIG. 1.

Referring to FIG. 2, DLL circuit 20 has its input node connected to an input buffer 11 that buffers external clock signal ext.CLK to generate an internal clock signal CLK, and its output node connected to an output buffer 12 that buffers data OH_F, OL_F to output the same as data output signal ext.DQS according to an internal clock signal for output DLLCLK.

DLL circuit 20 includes a variable delay circuit 23 delaying internal clock signal CLK from input buffer 11 to generate an internal clock signal for output DLLCLK, an output replica circuit 21 and an input replica circuit 22 as a replica delay circuit to delay for a predetermined time an internal clock signal for output DLLCLK directed to output from variable delay circuit 23, and a phase comparator 24 comparing the phase of the clock signal from input replica circuit 22 to the phase of internal clock signal CLK from input buffer 11.

Output replica circuit 21 applies to internal clock signal for output DLLCLK a delay time (Dro) identical to the delay time (Do) of output buffer 12. Input replica circuit 22 applies to internal clock signal for output DLLCLK a delay time (Dri) identical to the delay time (Di) of input buffer 11.

Phase comparator 24 compares the phase of internal clock signal for output DLLCLK from input replica circuit 22 to the phase of internal clock signal CLK from input buffer 11 to output a comparison resultant signal corresponding to the phase difference thereof.

By adjusting the delay according to the phase comparison resultant signal at variable delay circuit 23, the phase of the external clock signal can be set to be in phase with the data output.

Referring to FIG. 1 again, impedance adjustment circuit 30 includes an input circuit 31 generating an internal impedance adjustment signal IMP_UD and an impedance adjustment entry signal IMP_ENT based on an externally applied impedance control signal ext.IMP, and a data processing circuit 32 decoding internal impedance adjustment signal IMP_UD in synchronization with internal clock signal CLK to generate signals BUFON<4:0> of 5 bits to drive the output buffer.

External impedance control signal ext.IMP is a signal input by the user who is monitoring the output impedance at an external output terminal (not shown) of LSI 100 to control increase/decrease of the output impedance. Specifically, when the output impedance is lower than the characteristic impedance of a transmission line (not shown), the signal indicates a high voltage level to increase the output impedance. When the output impedance is higher than the characteristic impedance, the signal indicates a low voltage level to decrease the output impedance.

Output buffer drive signals BUFON<4:0> are signals that have two potential states corresponding to an H level and an L level. When this output buffer drive signals BUFON<4:0> are input to respective gates of the five transistors forming the output buffer, the valid/invalid state of the transistor is set according to the potential status thereof. For example, when the output buffer drive signal BUFON<n> of, for example, the n-th bit (n is an integer of at least 0 and not higher than 4) is rendered active at an H level, the n-th transistor is turned on to be set to a current driving status. When output buffer circuit BUFON<n> is rendered inactive at an L level, the n-th transistor is turned off, and current will not be driven.

In data processing circuit 32, internal impedance adjustment signal IMP_UD is decoded into 5-bit output buffer drive signals BUFON<4:0> so as to correspond to the number of current driving transistors (five in the present embodiment) forming output circuit 10. The number of bits to be decoded is not limited to that of the present invention, and is to be set corresponding to the number of transistors forming output buffer 10.

Output buffer drive signals BUFON<4:0> generated at data processing circuit 32 are applied to output replica circuit 21 in DLL circuit 20 as well as to output circuit 10 of the succeeding stage to adjust the impedance of output replica circuit 21 following the output impedance adjustment. A specific structure and operation of impedance adjustment circuit 30 will be described in detail hereinafter.

Figure 3:
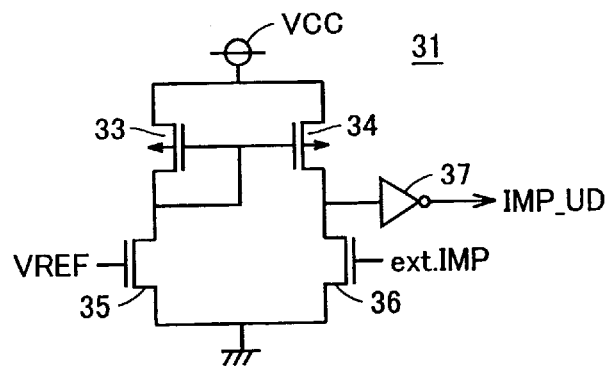
FIG. 3 shows an example of an input circuit in the impedance adjustment circuit of FIG. 1.

FIG. 3 shows an example of an input circuit 31 of impedance adjustment circuit 30 of FIG. 1.

Referring to FIG. 3, input circuit 31 is a current mirror differential amplifier including an N channel transistor 36 receiving external impedance control signal ext.IMP at its gate and an N channel transistor 35 receiving reference voltage VREF at its gate with P channel transistors 33 and 34 having their sources connected to external power supply node VCC as the load.

P channel transistors 33 and 34 form a current mirror circuit wherein P channel transistor 34 has its gate connected to the gate and drain of P channel transistor 33.

N channel transistors 35 and 36 have their drains connected to the drains of P channel transistors 33 and 34, respectively, and their sources connected to ground.

N channel transistors 35 has its drain connected to the drain and gate of P channel transistor 33 and to the gate of P channel transistor 34, and has its source connected to ground.

The drain of N channel transistor 36 that is the output node of the differential amplifier is connected to the input node of inverter 37. Although not shown, the output node of inverter 37 is connected to the input node of data processing circuit 32 of FIG. 1 to provide a signal that is an inversion of the output signal in logic level from the differential amplifier to data processing circuit 32 as an internal impedance adjustment signal IMP_UD.

When the voltage of external impedance control signal ext.IMP is higher than reference voltage VREF in the above-described structure, the output node of the differential amplifier takes a voltage corresponding to a logic level of L, and internal impedance adjustment signal IMP_UD takes a logic level of H.

When the voltage of external impedance control signal ext.IMP is lower than reference voltage VREF, the output node of the differential amplifier takes a voltage corresponding to the logic level of an H level whereas internal impedance adjustment signal IMP_UD attains a logic level of L.

Since the voltage level of external impedance control signal ext.IMP corresponds to the increase/decrease of the output impedance, an internal impedance control signal IMP_UD is generated of an H level and an L level when the output impedance is to be increased and decreased, respectively.

At the same time, input circuit 31 is rendered active (L to H) in response to an input of an external impedance control signal ext.IMP, whereby impedance adjustment entry signal IMP_ENT to enter an impedance adjustment mode is generated and transferred to data processing circuit 32.

Figure 4:
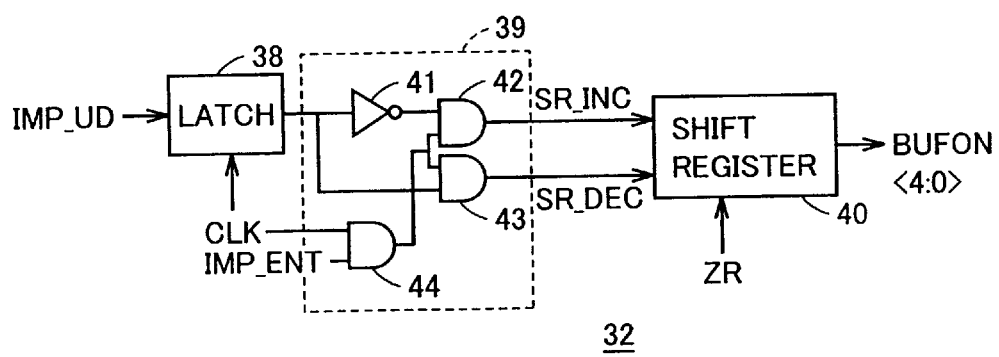
FIG. 4 shows an example of a data processing circuit in the impedance adjustment circuit of FIG. 1.

FIG. 4 shows an example of data processing circuit 32 of impedance adjustment circuit 30 of FIG. 1.

Referring to FIG. 4, data processing circuit 32 includes a latch circuit 38 to establish synchronization between internal impedance adjustment signal IMP_UD and internal clock signal CLK, a generation unit 39 to generate signals SR_INC and SR_DEC from internal impedance adjustment signal IMP_UD to control the decode operation of shift register 40 of the succeeding stage, and a shift register 40 generating output buffer drive signals BUFON based on shift register control signals SR_INC and SR_DEC.

Shift register control signals SR_INC and SR_DEC are signals generated from internal impedance adjustment signal IMP_UD and impedance adjustment entry signal IMP_ENT. As will be described in detail afterwards, shift register control signal SR_INC is decoded at shift register 40 to increment the value of output buffer drive signals BUFON<4:0>. Shift register control signal SR_DEC decrements the value of output buffer drive signals BUFON<4:0>.

Figure 5:
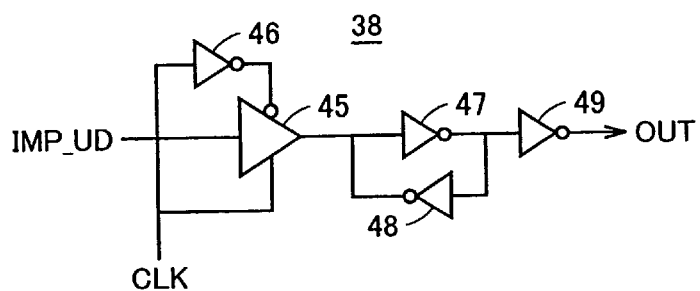
FIG. 5 shows an example of the latch circuit of FIG. 4.

FIG. 5 shows an example of latch circuit 38 of FIG. 4.

Referring to FIG. 5, latch circuit 38 includes a three-state buffer 45, and inverters 46, 47, 48 and 49.

Three-state buffer 45 receives an internal clock signal CLK at its control input terminal to carry out a buffer operation when internal clock signal CLK attains an active state, and provides an output of a high impedance state to be cut off from the internal when internal clock signal CLK attains an inactive state.

Therefore, internal impedance adjustment signal IMP_UD applied to three-state buffer 45 is buffered in response to internal clock signal CLK attaining an active state, and then latched at inverters 47 and 48 of succeeding stages to be output from the output node of the final-stage inverter 49 at a logic level identical to the input logic level.

Specifically, internal impedance adjustment signal IMP_UD passes through latch circuit 38 of FIG. 5 to establish synchronization with internal clock signal CLK.

Referring to data processing circuit 32 of FIG. 4 again, internal impedance adjustment signal IMP_UD in synchronization with internal clock signal CLK through latch circuit 38 is applied to respective first input nodes of 2-input AND circuits 42 and 43 of shift register control signal generation unit 39. 2-input AND circuit 32 receives an input that has the logic level inverted by inverter 41.

Impedance adjustment entry signal IMP_ENT is applied to the first input node of 2-input AND circuit 44. Internal clock signal CLK is applied to the second input node of 2-input AND circuit 44. Accordingly, impedance adjustment entry signal IMP_ENT establishes synchronization with internal clock signal CLK, and is applied to the second input nodes of 2-input AND circuits 42 and 43 of the succeeding stages. 2-input AND circuits 42 and 43 respond to input of impedance adjustment entry signal IMP_ENT of an H level at the second input nodes to provide to the output nodes an internal impedance adjustment signal IMP_UD of a logic level equal to that input at the input node. At this stage, the output signal of 2-input AND circuit 42 constitutes the above-described shift register control signal SR_INC whereas the output signal of 2-input AND circuit 43 constitutes shift register control signal SR_DEC. Specifically, when internal impedance adjustment signal IMP_UD is at an H level (=when output impedance is to be increased), shift register control signal SR_DEC of an H level is generated. When internal impedance adjustment signal IMP_UD is at an L level (=when output impedance is to be reduced), shift register control signal SR_INC of an H level is generated. These shift register control signals are applied to shift register 40 of the succeeding stage.

Figure 6A:
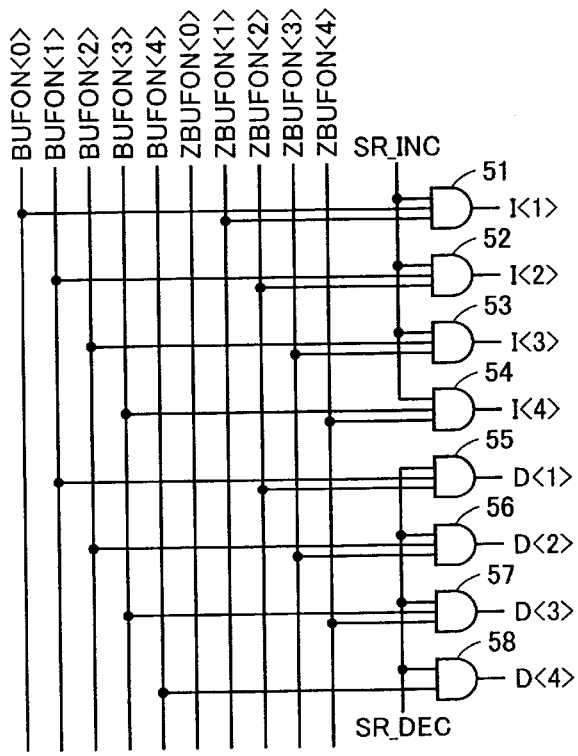
FIG. 6A shows an example of a decoder in the shift register of FIG. 4.
Figure 6B:
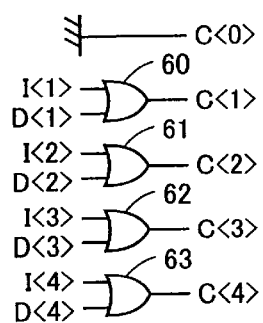
FIG. 6B shows an example of a combine circuit in the shift register of FIG. 4.
Figure 6C:
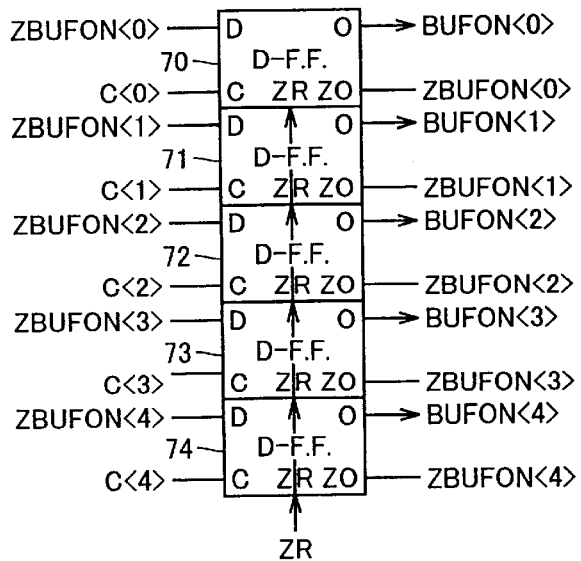
FIG. 6C shows an example of a D flip-flop group in the shift register of FIG. 4.

FIGS. 6A–6C show an example of a shift register 40 of FIG. 4, including a decoder (FIG. 6A), a combine circuit (FIG. 6B) and a D flip-flop group (FIG. 6C).

Referring to FIG. 6A, the decoder includes 3-input AND circuits 51–57 and 2-input AND circuit 58. 3-input AND circuits 51–54 receive shift register control signal SR_INC at their first input nodes. 3-input AND circuits 55–57 and 2-input AND circuit 58 receive a shift register control signal SR_DEC at their first input nodes.

3-input AND circuits 51–54 receive output buffer drive signals BUFON<0>–BUFON<3>, respectively at their second input nodes, and signals ZBUFON<1>–ZBUFON<4> complementary to the output buffer drive signals at their third input nodes. For example, 3-input AND circuit 51 receives the 0-th bit output buffer drive signal BUFON<0> at its second input node, and a signal ZBUFON<1> complementary to the first bit output buffer drive signal at its third input node. 3-input AND circuits 55–57 receive output buffer drive signals BUFON<1>–BUFON<3> at their second input nodes, and complementary signals ZBUFON<2>–ZBUFON<4> thereof at their third input nodes, respectively. For example, 3-input AND circuit 55 receives the first bit signal BUFON<1> at its second input node and the second bit signal ZBUFON<2> at its third input node.

2-input AND circuit 58 receives the fourth bit BUFON<4> at its second input node.

Accordingly, 3-input AND circuits 51–57 and 2-input AND circuit 58 output the operational result of the logical product of the input signals at respective output nodes. 3-input AND circuits 51–54 output increment signals I<4:1> (=I<1>–I<4>). 3-input AND circuits 55–57 and 2-input AND circuit 58 output decrement signals D<4:1>(= D<1>–<4>).

For example, signal I<n> of the n-th bit (n is a natural number of at least 1 and not more than 4) among the increment signals of I<4:1> attains an H level when output buffer drive signal BUFON<n−1> of the (n−1)th bit, signal ZBUFON<n> complementary to the output buffer drive signal of the nth bit, and shift register control signal SR_INC are all at an H level.

Consider the case when all the (n−1)th bit output buffer drive signal BUFON<n−1>, signal ZBUFON<n> complementary to the nth output buffer drive signal, and shift register control signal SR_INC are all at an H level. This corresponds to the case where the output impedance is to be reduced with the (n−1)th transistor ON and the nth transistor OFF in the output buffer. At the D flip-flop shown in FIG. 6C, output buffer control signal BUFON<n> of the nth bit exhibits a transition from an L level and an H level in response to increment signal I<n> attaining an H level to drive the corresponding nth transistor to an ON state. Thus, the output impedance is reduced by the increase of the total number of transistors driving the current in the output buffer.

Similarly, the nth bit decrement signal D<n> attains an H level when the nth bit output buffer drive signal ZBUFON<n>, signal SBUFON<n+1> complementary to the (n+1)th bit output buffer drive signal, and shift register control signal SR_DEC all attain an H level. This corresponds to the case where the output impedance is to be increased with the nth transistor ON and the (n+1)th transistor OFF in the output buffer. In this case, the nth bit output buffer drive signal BUFON<n> exhibits a transition from an H level to an L level in response to decrement signal D<n> attaining an H level, whereby the corresponding nth transistor is turned OFF. Thus, the output impedance is increased by reduction in the total number of transistors driving the current in the output buffer.

Decoded increment signal I<4:1> and decrement signal D<4:0> are applied to the combine circuit of FIG. 6B.

Referring to FIG. 6B, the combine circuit includes four parallel 2-input OR circuits 60–63 receiving increment signals I<4:1> and decrement signals D<4:1> at respective first and second input nodes. 2-input OR circuits 60–63 calculate the logical sum of the two signals to output control signals C<4:1>(=C<1>–C<4>) as the operation result.

The 0th bit control signal C<0> is set at the ground voltage level. This means that control signal C<0> is not substantially effective for a decode operation.

In FIG. 6B, control signals C<4:1> attain an H level when any of increment/decrement signals U<4:1>/D<4:1> is at an H level. Control signal C<4:0> is applied to the succeeding-stage D flip-flop group of FIG. 6C. In the D flip-flop group, the logic level of corresponding output buffer drive signal BUFON<n> is inverted in response to a control signal C<n> of an H level. Accordingly, output buffer drive signals BUFON<4:0> from the D flip-flop group of shift register 40 are incremented/decremented.

Referring to FIG. 6C, the D flip-flop group includes D flip-flops 70–74 of a parallel input/output structure.

D flip-flops 70–74 receive signals ZBUFON<4:0> complementary to the output buffer drive signal at respective data terminals D, and control signals C<4:0> from the combine circuit of FIG. 6B at respective clock terminals C.

D flip-flops 70–74 also receive a reset signal ZR to initialize shift register 40. Reset signal ZR attains an L level when initialization is required such as the time when power is turned on to initialize the value of shift register 40.

In response to such inputs, D flip-flops 70–74 output from output terminals O and ZO output buffer drive signals BUFON<4:0> and signals ZBUFON<4:0> complementary thereto at the activation timing of control signals C<4:0>.

Figure 7:
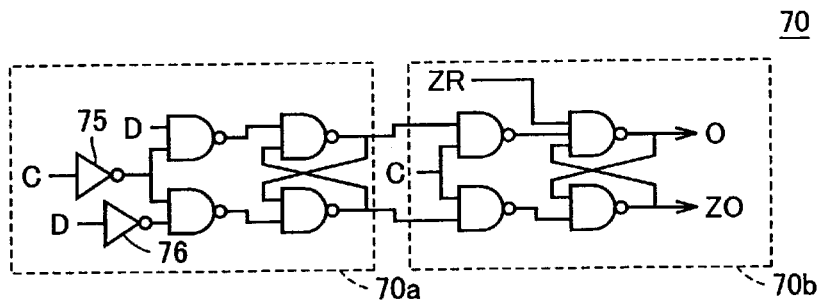
FIG. 7 shows a specific structure of the D flip-flop forming the D flip-flop group of FIG. 6C.

FIG. 7 shows a specific structure of D flip-flops 70–74 forming the D flip-flop group of FIG. 6C. Since they all have the same structure, the structure of D flip-flop 70 will be described representative thereof.

Referring to FIG. 7, D flip-flop 70 includes a negative edge trigger type flip-flop 70*a* with control signal C<0> generated at the combine circuit of FIG. 6B as the clock, operating at the fall of the clock, and a positive edge trigger type flip-flop 70*b* operating at the rise of the clock, connected in series.

Flip-flop 70a of the former stage receives signal ZBUFON<0> complementary to the output buffer drive signal at its first data terminal D, an inverted version thereof by inverter 76 at its second data input terminal D, and a control signal C<0> at its clock terminal C via inverter 75.

Flip-flop 70b of the latter stage receives the output signal of flip-flop 70a at its data input terminal, and control signal C<0> at clock terminal C. Flip-flop 70b also receives a reset signal ZR.

In D flip-flop 70 of the above structure, signal ZBUFON<0> complementary to the output buffer drive signal is entered into flip-flop 70a at the falling timing of control signal C<0> from an H level to an L level, and shifted to latter flip-flop 70b. Flip-flop 70b receives control signal C<0> at the rising timing thereof from an L level to an H level to be output from output terminal O. The output signal of output terminal O newly constitutes output buffer control signal BUFON<0>. In contrast, the output signal from output terminal ZO constitutes signal ZBUFON<0> complementary to output buffer control signal BUFON<0>.

Specifically, when any of increment signal I and decrement signal D is rendered active, control signal C attains an inactive state, whereby output buffer drive signal BUFON is inverted in logic level to be output from output terminal O of the D flip-flop at a timing identical to the activation timing of control signal C. Accordingly, the value of output buffer drive signals BUFON<4:0> from shift register 40 is incremented/decremented at the activation timing of shift register control signals SR_INC and SR_DEC to be transferred to output circuit 10 of the succeeding stage.

Output buffer drive signals BUFON<4:0> and complementary signal ZBUFON<4:0> are applied to the decoder of FIG. 6A and referred to at the next activation timing of the shift register control signal.

Figure 8:
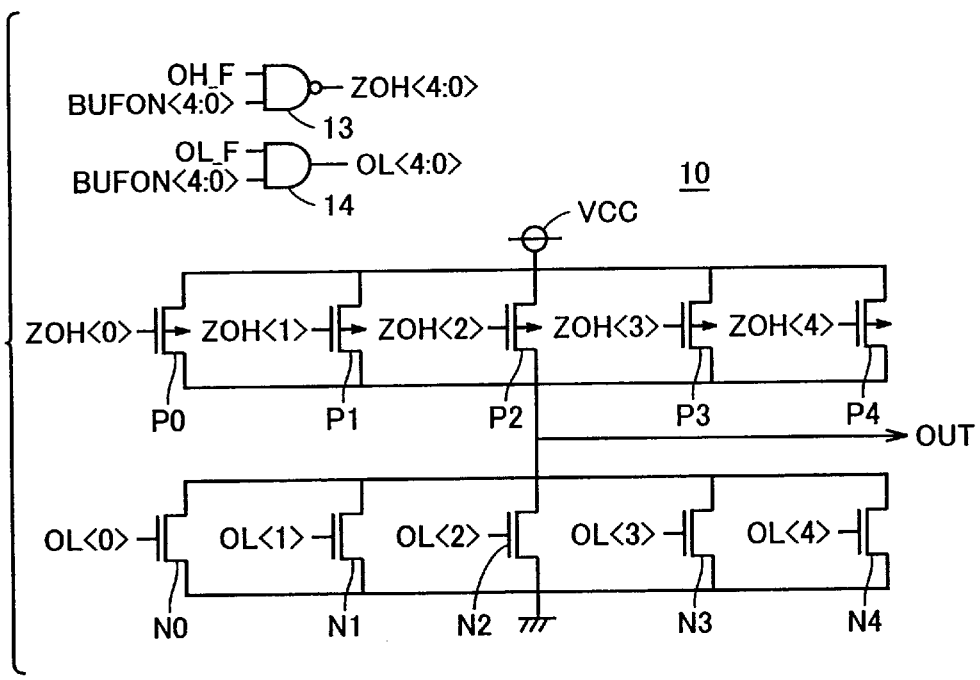
FIG. 8 shows an example of the output circuit of FIG. 1.

FIG. 8 shows an example of output circuit 10 of FIG. 1.

Referring to FIG. 8, output circuit 10 includes P channel transistors P0–P4 connected between power supply voltage and output node OUT, and N channel transistors N0–N4 connected between output node OUT and the ground voltage.

P channel transistors P0–P4 receive signals ZOH<4:0>(=ZOH<0>–ZOH<4>) that drives a corresponding P channel transistor at their gates which are the control nodes. N channel transistors P0–P4 are turned on in response to corresponding transistor drive signals ZOH<4:0> attaining a logic level of L to form a current path between the output node and the power supply voltage, whereby data output signal ext.DQS is pulled up to the power supply voltage level.

N channel transistors N0–N4 receive signals OL<4:0> (=OL<0>–OL<4>) driving a corresponding N channel transistor at their gates which are the control nodes. N channel transistors N0–N4 are turned on in response to corresponding transistor drive signals OL<4:0> attaining a logic level of H to form a current path between the output node and the ground voltage, whereby data output signal ext.DQS is pulled down to the ground voltage level.

Transistor drive signals ZOH<4:0> are signals output as the operation result between data signal OH_F and output buffer drive signals BUFON<4:0> in a corresponding 2-input NAND circuit 13 of FIG. 8. Therefore, each transistor drive signal ZOH corresponds to an inverted version of output buffer drive signal. BUFON<4:0> in logic level when H data is output (data OH_F=H).

Transistor drive signals OL<4:0> are signals output as the operation result between data signal OL_F and output buffer control signals BUFON<4:0> in a corresponding 2-input AND circuit 14. Therefore, transistor drive signals OL<4:0> become signals matching output buffer control signal BUFON<4:0> in logic level when L data is output (data OL_F=H).

In output circuit 10 of the structure of FIG. 8, output impedance is adjusted as set forth below by transistor drive signals ZOH and OL.

To output data output signal ext.DQS of an H level, P channel transistors P0–P4 receive transistor drive signals ZOH<0>–ZOH<4> at respective gates.

Since transistor drive signal ZOH<n> is an inverted version of output buffer logic signal BUFON<n> in logic level, transistor drive signal ZOH<n> attains an L level when output buffer drive signal BUFON<n> is at an H level, whereby corresponding P channel transistor Pn is turned on.

When output buffer drive signal BUFON<n> is at an L level, transistor drive signal ZOH<n> attains an H level, whereby P channel transistor Pn is turned off.

Each of P channel transistors P0–P4 is turned on/off corresponding to the H/L logic level of corresponding output buffer drive signals BUFON<4:0>.

Similarly, in the output of external data of an L level, N channel transistors N0–N4 receive transistor drive signals OL<0>–OL<4>, respectively, at their gates.

Since transistor drive signal OL<n> is a signal of a logic level identical to that of output buffer drive signal BUFON<n>, transistor drive signal OL<n> attains an H level when output buffer drive signal BUFON<n> is at an H level. Thus, corresponding N channel transistor Nn is turned on.

When output buffer drive signal BUFON<n> attains an L level, OL<n> is at an L level, whereby N channel transistor Nn is turned off.

Thus, each of N channel transistors N0–N4 is turned on/off corresponding to the H/L logic level of corresponding output buffer drive signals BUFON<4:0>.

Output buffer drive signals BUFON<4:0> are output signals of shift register 40 in data processing circuit 32 of FIG. 1. When output buffer drive signals BUFON<4:0> are incremented in response to activation (H level) of shift register control signal SR_INC, the nth bit output buffer BUFON<n> of "0" exhibits a transition to "1". When the corresponding nth P channel transistor Pn or N channel transistor Nn is turned on by output buffer drive signal BUFON<n> attaining "1", the number of transistors driving the current in output circuit 10 will be increased, whereby output impedance is reduced.

When output buffer drive signals BUFON<4:0> is decremented in response to activation (H level) of shift register control signal SR_DEC, the nth bit output buffer drive signal BUFON<n> of "1" exhibits a transition to "0". When the corresponding nth P channel transistor Pn or N channel transistor Nn is turned off by output buffer drive signal BUFON<n> attaining "0", the number of current drive transistors will be reduced to increase the output impedance.

Figure 9:
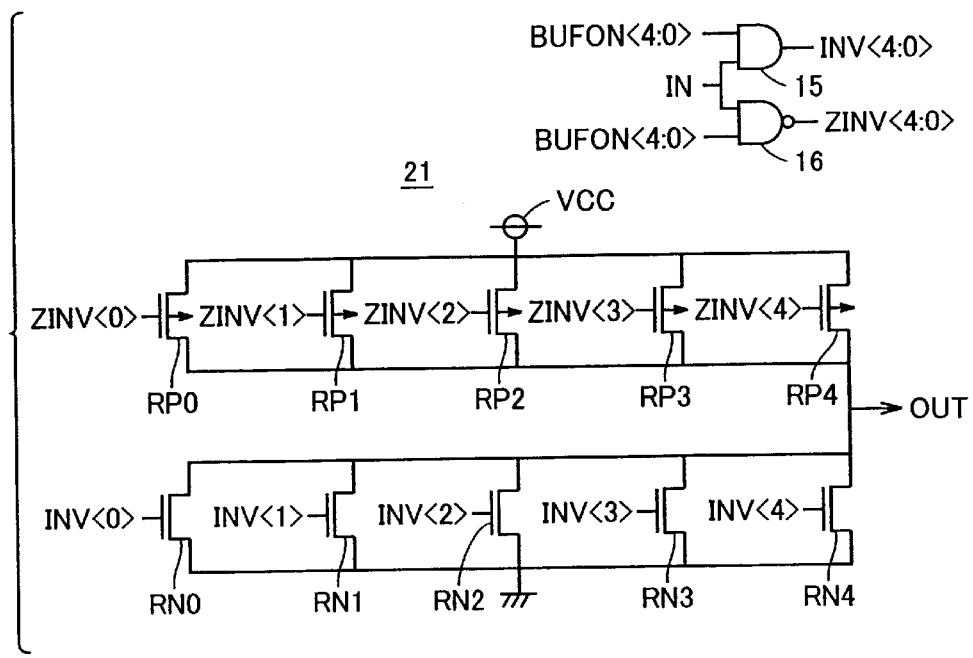
FIG. 9 shows an example of the output replica circuit of FIG. 1.

FIG. 9 shows an example of output replica circuit 21 of FIG. 1.

Referring to FIG. 9, output replica circuit 21 has a basic structure similar to that of output circuit 10 of FIG. 8 based on the essential object of compensating for delay of the output buffer.

Output replica circuit 21 includes P channel transistors RP0–RP4 connected between power supply voltage and output node OUT, and N channel transistors RN0–RN4 connected between output node OUT and ground voltage. P channel transistors RP0–RP4 receive replica drive signal ZINV<4:0> at their gates. N channel transistors RN0–RN4 receive replica drive signal INV<4:0> at respective gates.

Replica drive signals ZINV and INV are signals output as the operation result between output buffer drive signal BUFON<4:0> and internal clock signal for output DLLCLK in 2-input AND circuit 15 and 2-input NAND circuit 19 connected in parallel, depicted at the upper area of FIG. 9. Therefore, replica drive signals INV<4:0> and ZINV<4:0> indicate logic levels complementary to each other in synchronization with internal clock signal for output DLLCLK.

Since replica drive signals ZINV<4:0> are the inverted version of output buffer drive signals BUFON<4:0> in logic level, corresponding P channel transistor Pn is turned on and off when output buffer drive signal BUFON<n> is "1" and "0", respectively.

Replica drive signals INV<4:0> are signals of logic levels identical to that of output buffer drive signals BUFON<4:0>. Therefore, corresponding N channel transistor Nn is turned on and off when output buffer drive signal BUFON<n> is "1" and "0", respectively.

When output buffer drive signals BUFON<4:0> are input to output replica circuit 21 of the above structure concurrently with the input to output circuit 10 of FIG. 8, the impedance of output replica circuit 21 is adjusted following adjustment of the impedance of output circuit 10.

Figure 10:
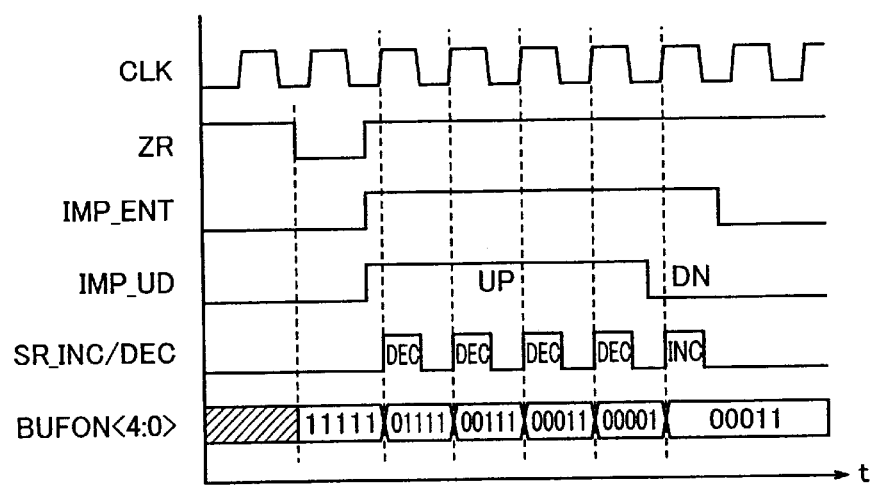
FIG. 10 is a timing chart to describe the output impedance adjustment in a semiconductor device according to a first embodiment of the present invention.

FIG. 10 is a timing chart to describe the output impedance adjustment in the semiconductor device of the first embodiment.

Referring to FIG. 10, the semiconductor device responds to activation of reset signal ZR at an L level to effect a reset operation at the initial setting. Since output buffer drive signals BUFON<4:0> are set to (11111) at the initial state, all of P channel transistors P0–P4 and N channel transistors N0–N4 of output circuit 10 of FIG. 8 are turned on, attaining a current drivable status. Output replica circuit 21 of FIG. 9 also receives output buffer drive signals BUFON<4:0>, whereby P channel transistors RP0–RP4 and N channel transistors RN0–RN4 are all turned on.

When initial setting is completed (transition of reset signal ZR from L to H), the user of the semiconductor device monitors the output impedance at the external output terminal of LSI 100 of FIG. 1 to input an external impedance control signal ext.IMP to impedance adjustment circuit 30. The input external impedance control signal ext.IMP is converted into an internal impedance adjustment signal IMP_UD at input circuit 31 in impedance adjustment circuit 30 to render active impedance adjustment mode entry signal IMP_ENT.

It is assumed that the monitored output impedance is lower than the characteristic impedance corresponding to all the transistors in output circuit 10 being set to a drive state. In this case, impedance adjustment circuit 30 responds to input of external impedance control signal ext.IMP of a high voltage level to render internal impedance adjustment signal IMP_UD to an H level.

Then, the activated impedance adjustment entry signal IMP_ENT and internal impedance adjustment signal IMP_UD are applied to data processing circuit 32 of FIG. 4 to be converted by latch circuit 38 and shift register control signal generation circuit 39 into a shift register control signal SR_DEC rendered active in synchronization with internal clock signal CLK to be applied to shift register 40.

Shift register control signal SR_DEC applied to shift register 40 is first decoded by the decoder. Since output buffer drive signals BUFON<4:0> are all "1" and shift register control signal SR_DEC is at an H level, only decrement signal D<4> attains an H level. In response, control signals C<0>–C<3> attain an L level and only control signal C<4> attains an H level in the combine circuit.

Then, when control signals C<4:0> are applied to the D flip-flop group, the flip-flop 74 responds to control signal C<4> of an H level to output an output buffer drive signal BUFON<4> having its logic level inverted to "0". Output buffer drive signals BUFON<3:0> do not have the logic level inverted, and are maintained at "1".

As shown in FIG. 10, output buffer drive signals BUFON<4:0> exhibit transition from (11111) to (01111). Therefore, the number of transistors driving output circuit 10 is reduced from five to four, whereby the output impedance is increased.

Similarly during an H level period of internal impedance adjustment signal IMP_UD, the value of output buffer drive signals BUFON<4:0> are decremented in a stepped manner by activated shift register control signal SR_DEC, whereby the output impedance is increased. When internal impedance adjustment signal IMP_UD exhibits transition from an H level to an L level, shift register control signal SR_INC is rendered active, whereby the value of output buffer drive signals BUFON<4:0> are incremented (from (00001) to (00011)). Therefore, the number of drive transistors in output circuit 10 is increased from 1 to 2, whereby the output impedance is reduced.

According to the semiconductor integrated circuit of the first embodiment, any adjustment of the impedance of the output circuit by an impedance adjustment signal will cause the impedance of the output replica circuit in the DLL circuit to be adjusted in a following manner by the impedance adjustment signal. Therefore, the DLL circuit can always compensate for the delay in the output buffer. Data transmission properly in synchronization with an external clock signal can be constantly carried out in an LSI.

[Modification]

Figure 11:
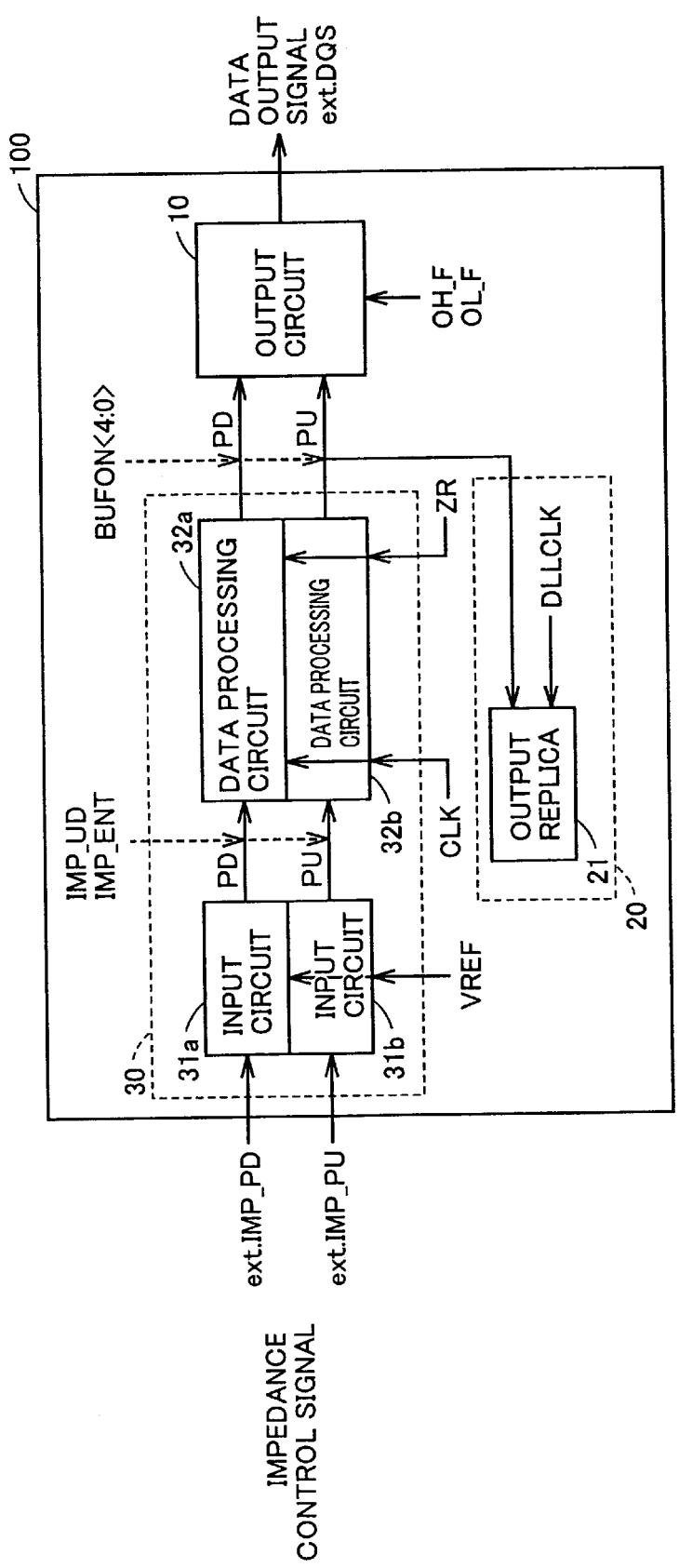
FIG. 11 schematically shows a structure of a semiconductor device according to a modification of the first embodiment.

FIG. 11 schematically shows a structure of a semiconductor device according to a modification of the first embodiment.

Referring to FIG. 11, the semiconductor device of the modification differs from the previous semiconductor device of the first embodiment in that impedance adjustment circuit 30 conducts impedance adjustment individually at the pull up and pull down of data output signal ext.DQS. Therefore, the external impedance control signal includes a signal ext.IMP_PU corresponding to pull up and a signal ext.IMP_PD corresponding to pull down. Impedance adjustment circuit 30 includes input circuits 31*a* and 31*b* and data processing circuits 32*a* and 32*b* corresponding to external control signals ext.IMP_PU and ext.IMP_PD, respectively. Respective structures of each of input circuits 31*a* and 31*b* and data processing circuits 32*a* and 32*b* are identical to those of input circuit 31 of FIG. 3 and data processing circuit 32 of FIG. 4. Therefore, detailed description thereof will not be repeated.

The user monitoring the output impedance at the external output terminal (not shown) of LSI 100 according to the structure of FIG. 11 applies to impedance adjustment circuit 30 an external impedance control signal ext.IMP_PU and ext.IMP_PD when data output signal ext.DQS is pulled up to the power supply voltage level and pulled down to the ground voltage level, respectively.

External impedance control signals ext.IMP_PU and ext.IMP_PD are decoded at corresponding input circuits 31*a* and 31*b* and data processing circuits 32*a* and 32*b* in impedance adjustment circuit 30 to be converted into output buffer control signals BUFON_PU<4:0>, BUFON_PD<4:0>, and then applied to output circuit 10.

Figure 12:
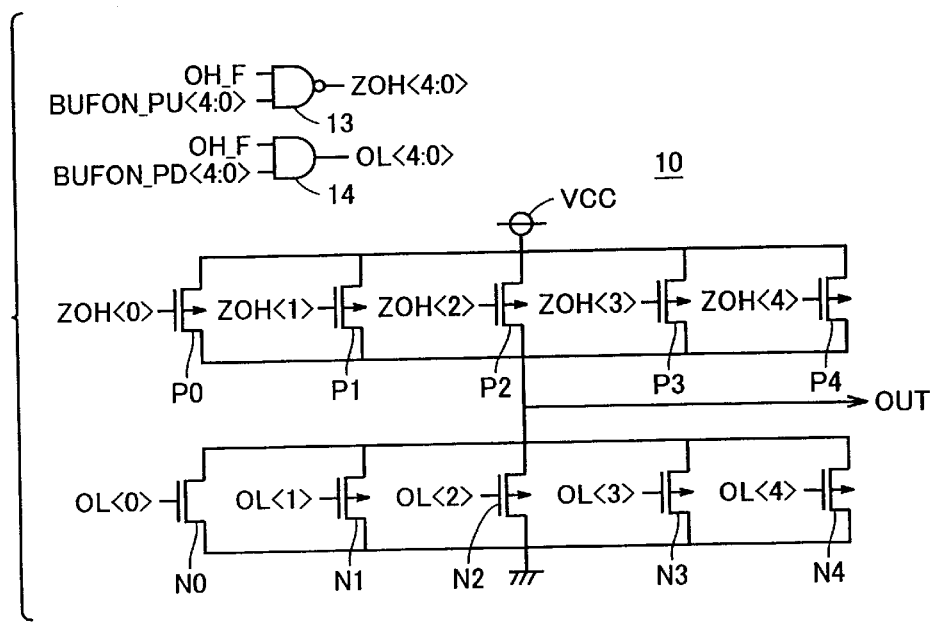
FIG. 12 shows an example of the output circuit of FIG. 11.

FIG. 12 shows an example of output circuit 10 of FIG. 11. Referring to FIG. 12, the basic structure is similar to output circuit 10 of FIG. 8, and includes P channel transistors P0–P4 and N channel transistors N0–N4 to drive the current.

Transistor drive signals ZOH, OL applied to each transistor are generated from data OH_F, OL_F and output buffer drive signals BUFON_PU<4:0>, BUFON_PD<4:0>, likewise the previous embodiment. It is to be noted that, since output impedance is adjusted individually at the pull up/pull down of an output signal, 2-input NAND circuit 13 receives data OH_F and output buffer control signals BUFON_PU<4:0> when in a pull up mode, and outputs transistor drive signals ZOH<4:0>.

2-input AND circuit 14 receives output data OL_F and output buffer control signals BUFON_PU<4:0> in a pull down mode to generate transistor drive signals OL<4:0>.

The relationship between transistor drive signals ZOH<4:0>, OL<4:0> and the output impedance is as shown previously in the first embodiment. Therefore, detailed description will not be repeated.

When data output signal ext.DQS is to be pulled up in output circuit 10 of FIG. 12, the output impedance is adjusted by controlling the number of P channel transistors driving the current from the power supply voltage to the output node by increment/decrement of output buffer drive signals BUFON_PU<4:0>. When data output signal ext.DQS is to be pulled down, the output impedance is adjusted by controlling the number of N channel transistors driving the current from the output node to the ground voltage by increment/decrement of output buffer drive signals BUFON_PD<4:0>.

DLL circuit 20 in LSI 100 of FIG. 11 can establish synchronization between the data output and an external clock signal properly by comparing the phase between internal clock signal CLK and internal clock signal for output DLLCLK delayed via input/output replica circuits 21 and 22. This timing for phase comparison is generally at the rise or fall of the other clock signal. For example, when phase comparison is to be conducted at the rise of the clock signal, DLL circuit 20 is referring to only the pull up of the data output signal.

In this case, output replica circuit 21 can compensate for the delay at the pull up in output circuit 10 by adjusting the impedance following the impedance adjustment of output circuit 10 in a pull up mode. Therefore, proper synchronization with the external clock signal can be established.

Thus, by adjusting the impedance with only output buffer drive signals BUFON_PU input to output replica circuit 21, data transmission can be conducted reliably in synchronization with an external clock signal.

When phase comparison is conducted at the fall of the clock signal in DLL circuit 20, output replica circuit 21 is input with output buffer drive signals BUFON_PD to conduct impedance adjustment following the impedance adjustment of output circuit 10 in a pull down mode.

Even in the case where impedance adjustment is conducted individually at pull up/pull down in output circuit 10, proper synchronization with an external clock signal can be established by output replica circuit 21 adjusting the impedance following adjustment of either output impedance to which the phase is referred to. Therefore, a similar advantage can be achieved without increasing the circuit complexity of output replica circuit 21 of the previous embodiment.

According to a semiconductor integrated circuit of a modification of the first embodiment, data transfer can be conducted properly in synchronization with an external clock signal by having the output replica circuit adjust the impedance following adjustment of either impedance for pull up/pull down that is the subject of phase comparison even in the case where the impedance adjustment of the output circuit is conducted individually for pull up/pull down. The DLL circuit of the present modification does not require increase of the circuit complexity in the DLL circuit of the previous embodiment.

Second Embodiment

Figure 13:
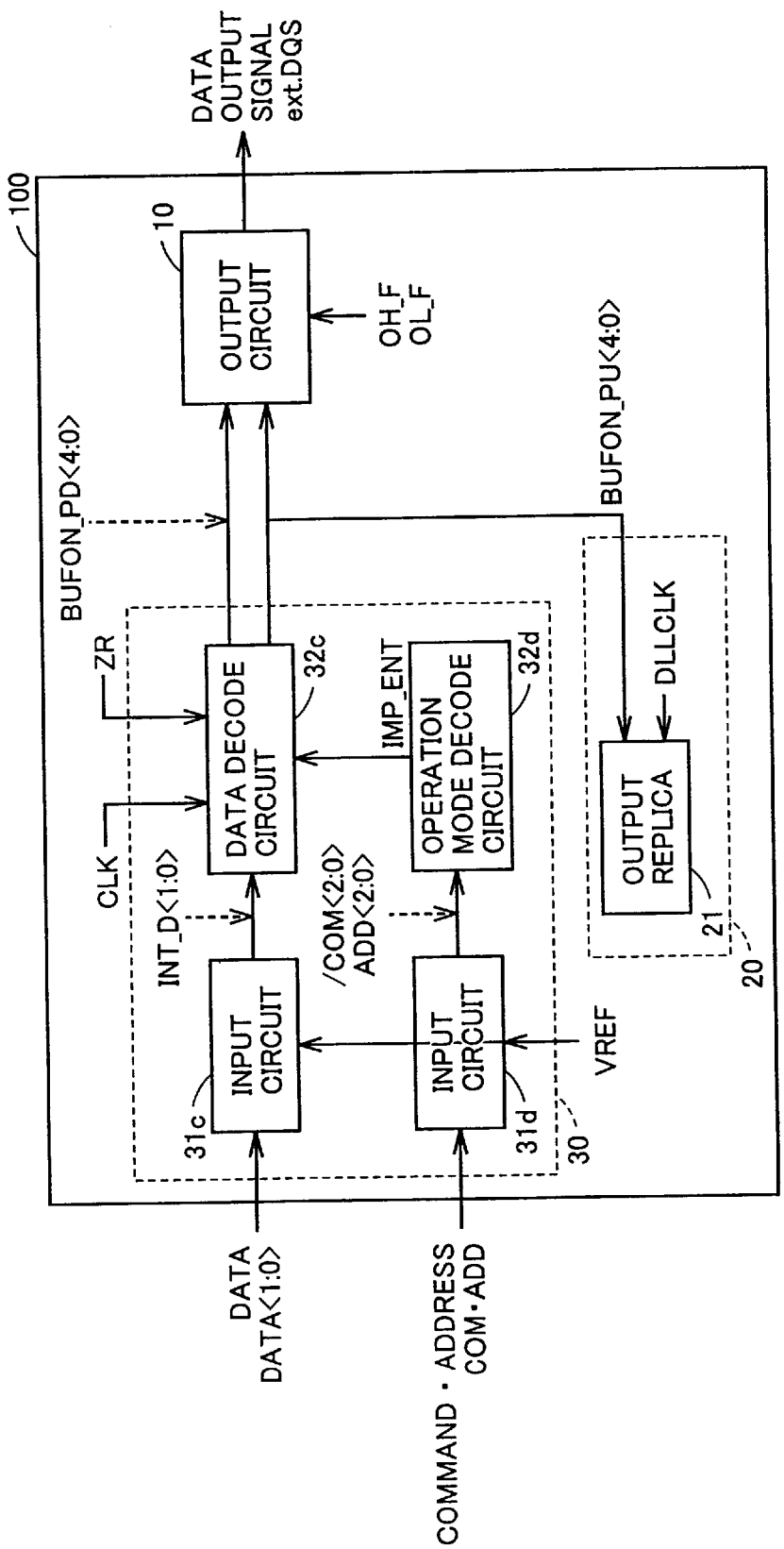
FIG. 13 schematically shows a structure of a semiconductor device according to a second embodiment of the present invention.

FIG. 13 schematically shows a structure of a semiconductor device according to a second embodiment of the present invention.

Referring to FIG. 13, the semiconductor device of the second embodiment differs from the semiconductor device of the first embodiment in the structure of impedance adjustment circuit 30. Impedance adjustment circuit 30 of the second embodiment includes an input circuit 31*c* to which an externally applied data signal is input, a data decode circuit 32*c*, an input circuit 31*d* receiving a command signal and an address signal, and an operation mode decode circuit 32*d*. The structure of output circuit 10 and DLL circuit 20 is identical to that shown in the first embodiment. Therefore, description thereof will not be repeated.

Impedance adjustment circuit 30 of the structure of FIG. 13 additionally includes, with respect to the impedance adjustment circuit of the first embodiment, means for generating an impedance adjustment entry signal IMP_ENT to enter the output impedance adjustment mode of output circuit 10, based on externally applied command and address signals.

The command signal and address signal are control signals for system control, sent from another LSI for transmitting/receiving data between LSIs. In a normal operation mode, these signals are combined to effect an operation based on a particular address. In the present embodiment, these signals are also used to set the operation mode at the initial setting of setting the conditions in data communication between LSIs. In this initial setting mode, impedance adjustment circuit 30 receives the command/address signals to enter an impedance adjustment mode to adjust the impedance. Therefore, impedance adjustment is completed in output replica circuit 21 as well as in output circuit 10 when initial setting has been completed. Therefore, data transmission properly in synchronization with an external clock signal is guaranteed immediately from completion of the initial setting.

Figure 14:
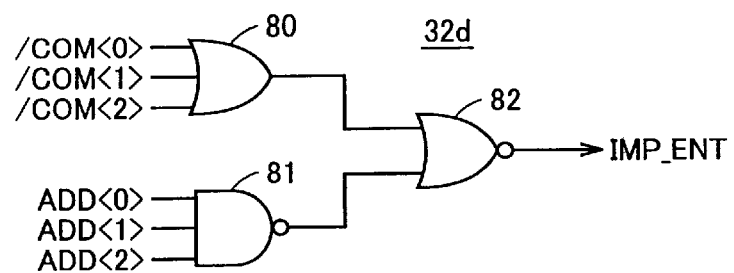
FIG. 14 shows an example of the operation mode decode circuit of FIG. 13.

FIG. 14 shows an example of an operation mode decode circuit 32*d* of FIG. 13. Referring to FIG. 14, operation mode decode circuit 32*d* includes a 3-input OR circuit 80 receiving command signals /COM<2:0>, a 3-input NAND circuit 81 receiving address signals ADD<2:0>, and a 2-input NOR circuit 82*d* receiving output signals of these logical circuits to output an impedance adjustment entry signal IMP_ENT.

3-input OR circuit 80 responds to command signals COM<0>, /COM<1>, and /COM<2> to output an operation result of the logical sum thereof. Therefore, the output signal attains an L level only when all the logic levels of command signals /COM<2:0> are at an L level.

3-input NAND circuit 81 receives address signals ADD<0>, ADD<1>, and ADD<2> to output an operation result which is an inverted version of the logical product thereof. Therefore, the output signal attains an L level only when all the logic levels of address signals ADD<2:0> attain an H level.

The logic level of impedance adjustment entry signal IMP_ENT which is the output signal of 2-input NOR circuit 82 of the succeeding stage corresponds to inversion of the logical sum of the output signal of the above logic circuits.

Therefore, impedance adjustment entry signal IMP_ENT is rendered active at a logic level of H only when all the logic levels of command signals /COM<2:0> attain an L level, and all the logic levels of address signals ADD<2:0> attain an H level. Thus, an impedance adjustment mode is entered.

Figure 15:
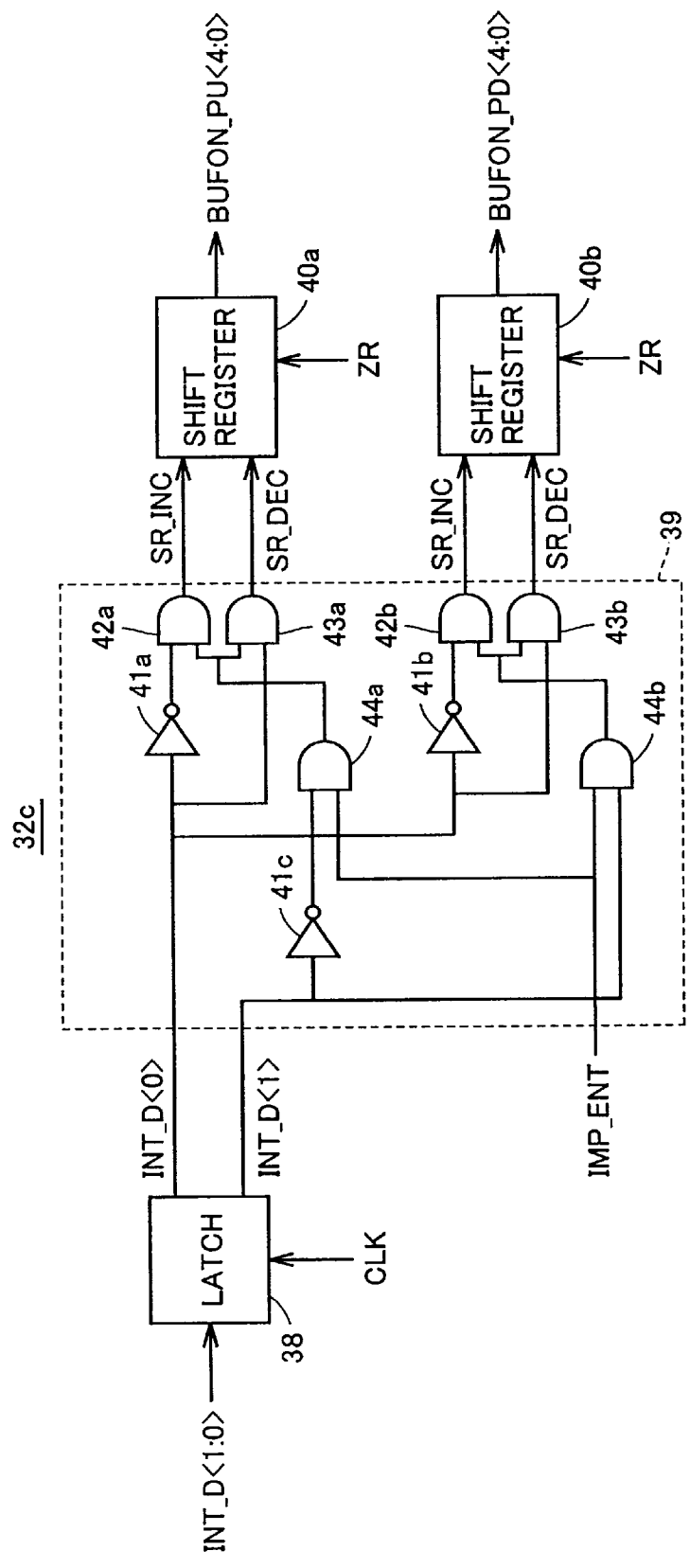
FIG. 15 shows an example of a data decode circuit of FIG. 13.

FIG. 15 shows an example of a data decode circuit 32c of FIG. 13.

Referring to FIG. 15, data decode circuit 32c includes a latch circuit 38, a shift register control signal generation unit 39, and shift registers 40a and 40b.

Latch circuit 38 generates internal data signals INT_D<1:0> in synchronization with internal clock signal CLK based on an external data signals DATA<1:0> that is the impedance control information.

External data signals DATA<1:0> include information in DATA<1> to select either the pull up side or pull down side of output circuit 10 for impedance adjustment. When DATA<L> is at an H level, the pull down side is selected. When DATA<1> is at an L level, the pull up side is selected.

DATA<0> includes information to designate increment/decrement if impedance. DATA<0> corresponds to external impedance control signal ext.IMP of the first embodiment, and attains an H level and an L level when the output impedance is to be increased and reduced, respectively.

Shift register control signal generation unit 39 includes 2-input AND circuits 42a, 42b, 43a, 43b, 44a, 44b, and inverters 41a, 41b, 41c to generate signals SR_INC, SR_DEC to increment/decrement the output values of shift registers 40a and 40b based on the above-described internal data signals INT_D<1:0>. Shift register control signal generation unit 39 basically has a structure similar to that of the first embodiment, and differs in the structure of generating shift register control signals SR_INC, SR_DEC for pull up and pull down to adjust the impedance individually for pull up and pull down.

According to the structure of FIG. 15, internal data signal INT_D<0> is applied to the first input node of 2-input AND circuit 42a via inverter 41a, and to the first input node of 2-input AND circuit 43a. At the same time, internal data signal INT_D<0> is applied to the first input node of 2-input AND circuit 42b via inverter 41b, and to the first input node of 2-input AND circuit 43b.

Internal data signal INT_D<1> is applied to the first input node of 2-input AND circuit 44a via inverter 41c, and to the first input node of 2-input AND circuit 44b.

Concurrently, impedance adjustment entry signal IMP_ENT from operation mode decode circuit 32d is applied to respective second input nodes of 2-input AND circuits 44a and 44b.

Then, 2-input AND circuits 44a and 44b output the operational result of the logical sum between internal data signal INT_D<1> and impedance adjustment entry signal IMP_ENT. The output signal of 2-input AND circuit 44a is applied to the second input nodes of 2-input AND circuits 42a and 43a. The output signal of 2-input AND circuit 44b is applied to the second input nodes of 2-input AND circuits 42b and 43b.

Upon entering an impedance adjustment mode (impedance adjustment entry signal IMP_ENT at an H level) in the case where internal data signal INT_D<1> is at an H level, 2-input AND circuit 44b provides an output signal of an H level, which is applied to 2-input AND circuits 42b and 43b to render shift register control signals SR_INC, SR_DEC of the pull down side active. Thus, impedance will be adjusted at the pull down side of output circuit 10.

When internal data signal INT_D<1> is at an L level, 2-input AND circuit 44a provides an output signal of an H level, which is applied to 2-input AND circuits 42a and 43a to render active shift register control signals SR_INC, SR_DEC at the pull up side. Accordingly, impedance will be adjusted at the pull up side of output circuit 10.

Shift registers 40a and 40b of the succeeding stages both have a structure identical to that of the first embodiment to respectively generate output buffer drive signals BUFON_PU<4:0>, BUFON_PD<4:0> based on shift register control signals SR_INC, SR_DEC. Detailed operation is common to that of the first embodiment. Therefore, description thereof will not be repeated.

Referring to FIG. 13, output buffer drive signals BUFON_PU<4:0>, BUFON_PD<4:0> generated at data decode circuit 32c are input to output circuit 10, whereby the number of transistors driven is increased/reduced in response to respective output buffer drive signals BUFON_PU<4:0>, BUFON_PD<4:0> to adjust the output impedance. The specific operation of impedance adjustment is identical to that described in the previous first embodiment. Therefore, description thereof will not be repeated.

Concurrently with the input towards output circuit 10, output buffer drive signals of the pull up side BUFON_PU<4:0> is applied to output replica circuit 21 in DLL circuit 20. The reason why only output buffer drive signals of the pull up side BUFON_PU<4:0> is input is because DLL circuit 20 adjusts the phase at the rising timing of an external clock signal, as indicated in the modification of the first embodiment.

Since output replica circuit 21 adjusts the impedance following the impedance adjustment of output circuit 30, the delay in output circuit 10 can be properly compensated for to realize data transfer properly in synchronization with an external clock signal.

Since impedance adjustment of output replica circuit 21 is conducted following impedance adjustment of output circuit 10 in the initialization mode of the LSI, data can be transferred properly in synchronization with an external clock signal immediately after completion of the initial operation mode.

If adjustment of output replica circuit 21 in DLL circuit 20 is to be conducted together with the impedance adjustment of output circuit 10 after the operation mode is set, an operation mode setting time that is not under control of the LSI controlling the system will be required. There is a possibility that data transmission is commenced without proper synchronization not yet established in the case where a data transmission command is issued immediately after the operation mode set period from a system control LSI. This disadvantage can be overcome by employing the structure of the present embodiment.

Furthermore, the user of LSI 100 can clearly identify that data transmission properly in synchronization with an external clock signal can be commenced simultaneous to completion of the operation mode setting.

According to the semiconductor integrated circuit of the second embodiment, impedance adjustment of the output replica circuit is conducted following impedance adjustment of the output circuit during the operation mode setting of data transfer for an LSI. Therefore, data transfer properly in synchronization with an external clock signal can be conducted immediately after completion of the operation mode setting.

[Modification]

Figure 16:
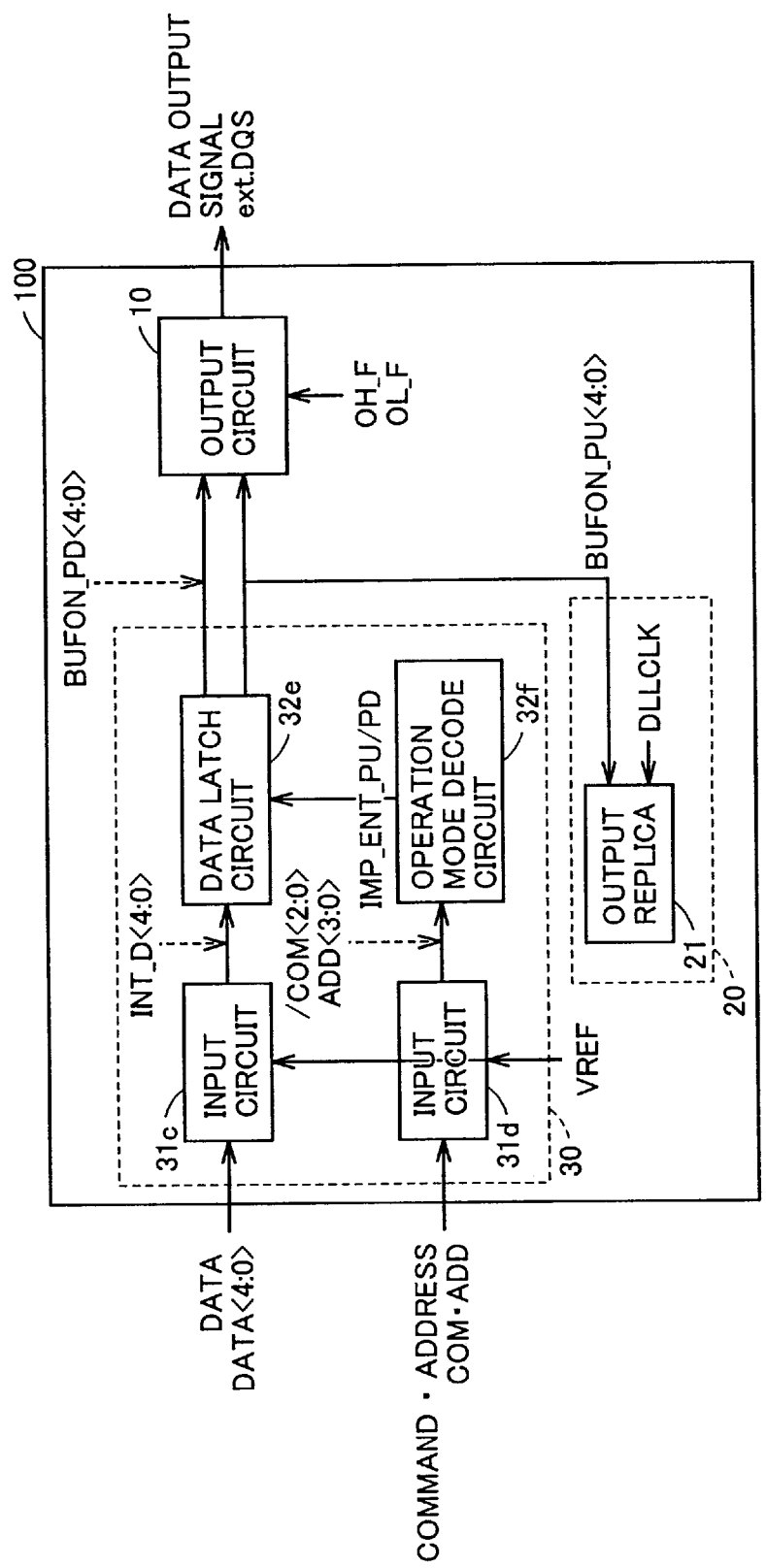
FIG. 16 schematically shows a structure of a semiconductor device according to a modification of the second embodiment.

FIG. 16 schematically shows a structure of a semiconductor device according to a modification of the second embodiment.

Referring to FIG. 16, LSI 100 includes an output circuit 10, a DLL circuit 20, and an impedance adjustment circuit 30.

Impedance adjustment circuit 30 of the present modification has a structure similar to that of the previous impedance adjustment circuit 30 of FIG. 13, provided that data decode circuit 32c of FIG. 13 is replaced with a data latch circuit 32e. Description of common elements will not be repeated.

In impedance adjustment circuit 30 of the structure of FIG. 16, input circuits 31c and 31d receive external data signals DATA<4:0> which are the impedance control information and a command signal COM/an address signal ADD to set the operation mode, respectively.

External data DATA<4:0> differ from the external data DATA<1:0> of the previous embodiment in that information to control individually the drive of each transistor in output circuit 10 is included. In the present modification, external data DATA<4:0> are directly converted into output buffer drive signals BUFON<4:0> without being decoded at impedance adjustment circuit 30 for impedance adjustment.

As shown in FIG. 16, each of input circuits 31c and 31d generates an internal data signals INT_D<4:0> formed of binary information of H/L, command signals /COM<2:0> and address signals ADD<3:0>, based on reference voltage VREF in the internal differential amplifier not shown.

Internal data signals INT_D<4:0> are supplied to data latch circuit 32e of the succeeding stage. Command signals /COM<2:0> and address signals ADD<3:0> are applied to operation mode decode circuit 32f.

Figure 17:
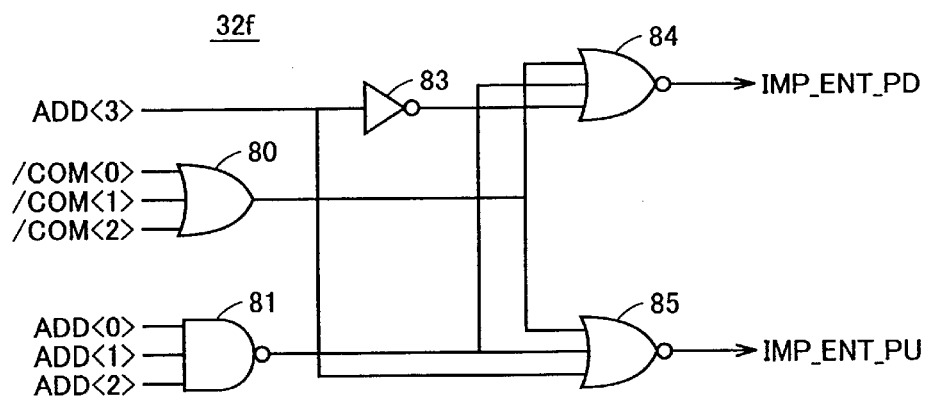
FIG. 17 shows an example of an operation mode decode circuit of FIG. 16.

FIG. 17 shows an example of operation mode decode circuit 32f of FIG. 16.

Referring to FIG. 17, operation mode decode circuit 32f generates an impedance adjustment entry signal IMP_ENT from command signals /COM and address signals ADD, likewise operation mode decode circuit 32d. Accordingly, impedance adjustment of output circuit 10 is conducted when the operation mode is set.

Specifically, operation mode decode circuit 32f includes a 3-input OR circuit 80, a 3-input NAND circuit 81, an inverter 83, and 3-input NOR circuits 84 and 85.

3-input OR circuit 80 receives command signals /COM<2:0> at each input node to output an operation result of a logical sum thereof. The output signal is supplied to respective first input nodes of 3-input NOR circuits 84 and 85 of the succeeding stage.

3-input NAND circuit 81 receives address signals ADD<2:0> at each input node to output the operation result corresponding to an inversion of the logical product. The output signal is applied to respective second input nodes of 3-input NOR circuits 84 and 85.

3-input NOR circuit 84 receives address signal ADD<3> via inverter 83 at the third input node to output an operation result corresponding to an inversion of the logical sum of the input signals. The output signal constitutes impedance adjustment entry signal IMP_ENT_PD at the pull down side of output circuit 10. 3-input NOR circuit 85 receives address signal ADD<3> at the third input node. The output signal from 3-input NOR circuit 85 corresponding to an operation result of the input signals constitutes impedance adjustment entry signal IMP_ENT_PU of the pull up side of output circuit 10.

Operation mode decode circuit 32f of the present modification has a structure similar to that of operation mode decode circuit 32d of the second embodiment. The output signal from 3-input OR circuit 80 attains an L level when only all command signals /COM<2:0> attain an L level whereas the output signal from 3-input NAND circuit 81 attains an L level when all address signals ADD<2:0> attain an H level. These output signals are applied to 3-input NOR circuits 84 and 85 of the succeeding stage.

Operation mode decode circuit 32f of the present modification differs from operation mode decode circuit 32d in that address signal ADD<3> is applied to 3-input NOR circuits 84 and 85. Therefore, the output signals of 3-input NOR circuits 84 and 85 attain an H level only when all the three input signals attain an L level.

Specifically, when address signal ADD <3> is at an H level, all the input signals of 3-input NOR circuit 84 attain an L level, whereby the output impedance adjustment entry signal of the pull down side IMP_ENT_PD is rendered active at an H level. Accordingly, an impedance adjustment mode is entered at the pull down side of output circuit 10.

When address signal ADD<3> is at an L level, all the input signals to 3-input NOR circuit 85 attain an L level, whereby the output impedance adjustment entry signal of the pull up side IMP_ENT_PU is rendered active at an H level.

To summarize, address signal ADD<3> is a signal to determine whether the impedance is to be adjusted at the pull up side or pull down side of output circuit 10. In response to this signal, output circuit 10 enters an impedance adjustment mode independently between the pull up side and the pull down side.

Figure 18:
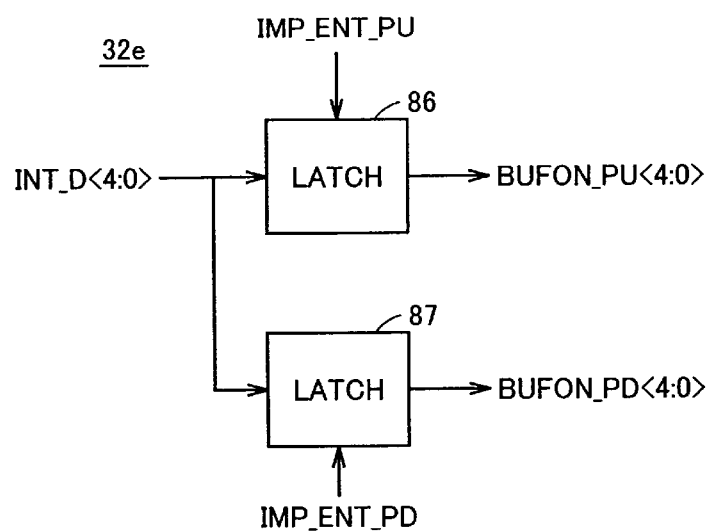
FIG. 18 shows an example of the data latch circuit of FIG. 16.

FIG. 18 shows an example of data latch circuit 32e of FIG. 16.

Referring to FIG. 18, data latch circuit 32e includes two latch circuits 86 and 87.

Latch circuits 86 and 87 receive internal data signals INT_D<4:0>, and also impedance adjustment entry signals IMP_ENT_PU, IMP_ENT_PD generated at operation mode decode circuit 32f of FIG. 17 as the signals to control the latch timing.

As shown in FIG. 18, latch circuit 86 retains internal data signals INT_D<4:0>, and responds to activation of impedance adjustment entry signal IMP_ENT_PU to output the output buffer drive signals of the pull up side BUFON_PU<4:0>.

Similarly, latch circuit 87 retains internal data signals INT_D<4:0>, and responds to activation of impedance adjustment entry signal IMP_ENT_PD to output the output buffer drive signals of the pull down side BUFON_PD<4:0>.

Therefore, output circuit 10 receives these output buffer drive signals to conduct impedance adjustment independently between the pull up side and the pull down side.

When output buffer drive signals BUFON_PU<4:0> are concurrently applied to output replica circuit 21, impedance is adjusted following the impedance adjustment of output circuit 10 at the pull up side.

The present embodiment is effective in the case where the impedance control signal is already decoded and impedance of output circuit 10 can be adjusted directly in the semiconductor device of the second embodiment. In other words, the mounting area can be reduced since the decode circuit can be omitted.

Similar to the previous embodiment, adjustment of output replica circuit 21 can be conducted based on a signal that is already decoded. Therefore, an advantage similar to that of the previous embodiment can be achieved while reducing the mounting area.

According to the modification of the second embodiment, the impedance of the output replica circuit is adjusted following adjustment of the impedance of the output circuit when the operation mode is set in a data transmission operation of an LSI. Therefore, data can be transferred properly in synchronization with an external clock signal immediately when the operation mode setting is completed.

Furthermore, since the impedance can be adjusted based on a control signal that is already decoded outside, increase in the mounting area due to provision of a decode circuit in an LSI can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operating in synchronization with an external clock signal, comprising:
    a clock generation circuit generating an internal clock signal in synchronization with said external clock signal;
    an output circuit providing a data signal output from said semiconductor device in response to said internal clock signal; and
    an impedance adjustment circuit generating an impedance adjustment signal to adjust an output impedance of said output circuit,
    said clock generation circuit including a replica delay circuit to delay said internal clock signal for a predetermined time corresponding to a predetermined time of a data signal output operation of said output circuit,
    said impedance adjustment circuit applying said impedance adjustment signal to said output circuit and also to said replica delay circuit.

2. The semiconductor device according to claim 1, wherein said impedance adjustment circuit generates said impedance adjustment signal based on an impedance control signal input from a source external to said semiconductor device.

3. The semiconductor device according to claim 2, wherein each of said output circuit and said replica delay circuit comprises an output buffer to output said data signal having first and second levels to an output node,
    wherein said output buffer comprises
        a plurality of first transistors including a control node, connected in parallel between a voltage corresponding to said first level and said output node,
        a plurality of second transistors including a control node, connected in parallel between a voltage corresponding to said second level and said output node,
        wherein, upon receiving said impedance adjustment signal at the control node of each of said plurality of first transistors, a predetermined number of transistors are selected from said plurality of first transistors according to a voltage of said impedance adjustment signal to form a current path between the voltage corresponding to said first level and said output node to output a data signal of said first level, and
        wherein, upon receiving said impedance adjustment signal at the control node of each of said plurality of second transistors, a predetermined number of transistors is selected from said plurality of second transistors according to the voltage of said impedance adjustment signal to form a current path between the voltage corresponding to said second level and said output node to output a data signal of said second level.

4. The semiconductor device according to claim 1, further comprising input means for a signal setting an operation mode when said semiconductor device is to transfer data at an initial setting period after power is turned on,
    wherein said impedance adjustment circuit generates said impedance adjustment signal based on said operation mode setting signal to apply the generated impedance adjustment signal to said output circuit and to said replica delay circuit.

* * * * *